United States Patent [19]

Passow et al.

[11] Patent Number: 5,596,539

[45] Date of Patent: Jan. 21, 1997

[54] METHOD AND APPARATUS FOR A LOW POWER SELF-TIMED MEMORY CONTROL SYSTEM

[75] Inventors: Robin H. Passow, Maple Plain; Gordon W. Priebe, Champlin; Ronald D. Isliefson, Lakeville; I. Ross Mactaggart, Eden Prairie; Kevin R. LeClair, Prior Lake, all of Minn.

[73] Assignee: LSI Logic Corporation, Milpitas, Calif.

[21] Appl. No.: 579,792

[22] Filed: Dec. 28, 1995

[51] Int. Cl.$^6$ ............................................. G11C 7/00
[52] U.S. Cl. ................................. 365/210; 365/208
[58] Field of Search ................................. 365/210, 207, 365/208, 233

[56] References Cited

U.S. PATENT DOCUMENTS

| | | | |
|---|---|---|---|
| 4,982,364 | 1/1991 | Iwahashi | 365/189.09 |
| 5,027,326 | 6/1991 | Jones | 365/221 |
| 5,031,142 | 7/1991 | Castro | 365/49 |
| 5,204,841 | 4/1993 | Chappell et al. | 365/230.05 |
| 5,226,014 | 7/1993 | McManus | 365/210 |
| 5,255,233 | 10/1993 | Izumi | 365/207 |
| 5,289,403 | 2/1994 | Yetter | 365/49 |
| 5,307,356 | 4/1994 | Fifield | 371/40.1 |
| 5,325,337 | 6/1994 | Buttar | 365/210 |
| 5,473,568 | 12/1995 | Okamura | 365/210 |
| 5,502,681 | 3/1996 | Park | 365/210 |

FOREIGN PATENT DOCUMENTS

| | | |
|---|---|---|
| 5-166365 | 7/1993 | Japan . |
| 6-223569 | 8/1994 | Japan . |

*Primary Examiner*—David C. Nelms
*Assistant Examiner*—Son Mai
*Attorney, Agent, or Firm*—Katz & Cotton, LLP

[57] ABSTRACT

A self-timed memory control system including a dummy row and column of memory cells along adjacent edges of a core memory array. Control logic receives an external clock signal and initiates address decoding, and also asserts a sense enable signal for activating the sense amplifiers. A dummy driver receives the enable signal and asserts a select signal on a dummy select line, which causes a memory access to occur in the dummy portion simultaneously with each access of the core memory array. A fixed memory cell in the dummy path always asserts a logic zero to a dummy sense amplifier, which senses the logic zero and respondingly asserts a timing signal. The dummy sense amplifier is biased with a voltage offset to favor a logic one, so that the timing signal is preferably delayed until after the output data of the core memory array has stabilized. The control logic detects the assertion of the timing signal and respondingly latches the output data, and the control logic also shuts down the sense amplifiers to prevent further power drain. In this manner, the output data is latched and the sense amplifiers are disabled as soon as possible to conserve energy but within a safe timing margin to assure that valid data is properly latched. A biased inverter is preferably added for further timing margin. The sense amplifiers preferably include an input level-shifter stage for proper operation at low voltage levels.

31 Claims, 5 Drawing Sheets

METHOD AND APPARATUS FOR A LOW POWER SELF-TIMED MEMORY CONTROL SYSTEM

BACKGROUND OF THE INVENTION

1. Technical Field of the Invention

The present invention relates to memory devices, and more particularly to a memory control system using a dummy bit line sensing scheme for providing power down timing and a bit line offset voltage for timing margin control to reduce power consumption.

2. Description of the Related Art

Memory devices typically include an array or matrix of memory cells for storage and retrieval of data, where the array of memory cells are arranged in rows and columns. Although many architectures are possible, a row or word line decoder including a plurality of word line drivers and a column decoder are provided for decoding an address for accessing a particular location of the memory array. Sense amplifiers are enabled to sense the data from the memory cells in the array. It is desired to shut down the data sense amplifiers as soon as possible since they consume appreciable power while activated. Various methods are known for achieving low power dissipation, many of which include self-timing schemes. Most of these schemes, however, are not operable or reliable at reduced power supply voltages, do not provide the means for timing margin control and are not designed to reduce power across the wide range of memory configurations required for a compiler application.

Many designs are not self-timed and thus depend upon a subsequent clock edge for termination of the cycle. Such clock dependence restricts the clock duty cycle and potentially dissipates more power since the sense amplifiers of the memory array remain active longer than necessary. Other self-timing schemes do not closely track the core memory array read/write sense, thereby resulting in a longer access cycle time and increased power dissipation. Self-timing sensing schemes are also known for memory compilers. However, known compiler self-timing schemes are often designed to operate correctly for a wide range of memory sizes and thus are based on the worst case or largest size configuration only. These schemes are often not designed to track the size and thus do not optimize power usage for all possible configurations, particularly for smaller memory arrays. Another self-timing scheme includes no timing margin control to assure that the core memory array access is completed before power down is initiated, often resulting in memory errors.

Most of the known sensing schemes are not operable or reliable at low power supply voltages below 2.0 volts, and thus require higher voltage and power levels. It is desired to provide a synchronous memory with low power architecture and with self-timing margin control to reduce power usage across a wide range of memory configurations required for a compiler application. It is also desired that the memory operate correctly at lower voltage levels, such as 1.8 volts or less.

SUMMARY OF THE INVENTION

It is therefore an object of the present invention to provide a method and apparatus for a low power self-timed memory control system.

Another object is to provide a synchronous memory with self-timing margin control at low power usage across a wide range of memory configurations required for a compiler application.

Another object is to control and operate a memory correctly at lower voltage levels, such as 1.8 volts or less.

A memory core array generally comprises a plurality of memory cells arranged in rows and columns, where each cell stores a corresponding data bit. Each row of memory cells is enabled by a corresponding word line signal asserted on a corresponding word line by an array of word line drivers. Only one of the word line signals for the memory core array is asserted at a time. For each memory access cycle, an address is provided to a word line decoder which decodes the address and asserts one of the word line signals corresponding to the address. Each column of memory cells is connected to a complementary pair of bit line signals. For read cycles, the enabled memory cell in each column drives a corresponding bit line and a complementary bit line forming a pair of complementary bit lines. For write cycles, a row of data buffers drive the complementary bit lines. A row of sense amplifiers typically runs along the bottom of the memory array, where each sense amplifier senses the enabled memory cell for accessing the corresponding data bit. A corresponding array of output latches are coupled to the array of sense amplifiers for latching the output data during each memory access. It is noted that during read and write cycles, the data is typically provided at the output, so that read and write cycles are similar.

A self-timed memory control system according to the present invention uses a dummy bit line sensing scheme for providing power down control timing and a bit line offset voltage for timing margin control. A dummy row and a dummy column of memory cells are provided along the outer edges of the core memory array to form a substantially worst case timing path for that particular array size. Control logic receives an external clock signal and asserts a word line enable signal to initiate address decoding, and also asserts sense enable signals for activating each of the sense amplifiers. A dummy word line and a dummy sense amplifier are also enabled for sensing a predetermined logic level asserted on the dummy path as described further below.

Word line decode circuitry includes a dummy word line driver, which receives a word line enable signal from control logic during every access cycle, and correspondingly asserts a dummy word line select signal. The dummy select signal causes a memory read access to occur in the dummy portion simultaneously with each access of the core memory array. A fixed memory cell is provided in the dummy path for asserting predetermined logic levels on a pair of complementary dummy bit lines to the dummy sense amplifier. The fixed memory cell is preferably positioned at the intersection of a dummy row and column to represent the worst case timing for the particular size of the memory array. In particular, the fixed memory cell is located on the opposite end of the dummy row from the dummy driver, and is located on the opposite end of the dummy column from the dummy sense amplifier.

The dummy sense amplifier is coupled to the pair of complementary dummy bit lines for sensing the predetermined logic level asserted by the fixed cell, where the dummy sense amplifier responds by asserting a timing signal. The dummy sense amplifier is biased with a voltage offset to favor a logic level opposite the predetermined logic level to ensure that the timing signal does not occur prior to the time that the corresponding logic levels are sufficiently developed on the complementary bit lines. This voltage offset also ensures that the timing signal is delayed until after the output data of the core memory array has stabilized. The control logic detects the assertion of the timing signal and responds by asserting latch signals to the array of latches to latch the output data, and the control logic also deasserts the word line enable and sense enable signals to shut down the sense amplifiers and prevent further power drain in the memory array. In this manner, the output data is latched and the sense amplifiers are shut down as soon as possible to conserve energy but within a safe timing margin to assure that valid data is latched.

In a first embodiment according to the present invention, the row of dummy memory cells runs across the top of the memory array, which is driven by the dummy word line driver. The dummy word line driver is enabled during every memory access at the same time as the core array word line via the rising edge of an external clock. The dummy memory cells are enabled by the word line dummy driver, but are not coupled to the corresponding bit lines of the respective column core memory cells. Thus, although the dummy memory cells assert no data, they simulate a substantially identical load to the dummy word line driver as the core memory word line drivers. The dummy sensing column is located along the outer edge of the memory core array furthest from the dummy word line driver. The fixed memory cell is preferably located at the intersection of the dummy row and dummy column. Only the fixed memory cell asserts data on the pair of complementary dummy bit lines during each access, where the remaining column of dummy memory cells do not provide data, but are connected for purposes of simulating bit line loading for timing purposes.

Although the dummy memory cells in the dummy row and dummy column do not assert data, they are implemented substantially identically as the actual core memory cells. In particular, they include pass transistors with substantially the same gate capacitance so as to mimic the loading associated with the actual core cells. In this manner, the timing associated with the dummy select line and the pair of corresponding dummy bit lines is substantially identical to the word and bit lines of the core array, except that the dummy path is slightly longer than the longest path in the memory array.

In an alternative embodiment according to the present invention, only a dummy column of fixed memory cells are provided and located along the outer edge of the memory core array furthest from the word line drivers. Each dummy column cell is fixed to assert a predetermined logic level on the dummy bits lines in a similar manner as the singular fixed dummy cell of the first embodiment. Since the dummy row is eliminated, this embodiment allows a smaller memory array. Further, the timing path for the self timing signal has less margin for matching the memory array to an even closer degree. Nonetheless, the dummy column still represents the worst case timing of the array.

In the preferred embodiment, an array of precharge pull-up devices are provided for precharging all of the pairs of complementary bit lines, including the dummy bit lines, to a high logic or logic one level. Furthermore, an array of precharge pull-up devices precharge the outputs of the sense amplifiers including the output timing signal of the dummy sense amplifier. The control logic enables the precharge devices prior to a memory access, and then disables the precharge devices when the clock signal is initially asserted to initiate a memory access. The activated dummy memory cell is preferably hard-wired to assert a logic zero, which is the slowest read for the sense amplifiers as well as the dummy sense amplifier because of their precharged state.

The dummy sense amplifier is preferably implemented using substantially identical design and layout as the core array sense amplifiers, yet always reads the logic zero data state asserted by the activated dummy memory cell during each memory access. In particular, the dummy sense amplifier forces a read imbalance via a modified width-to-length ratio in one of its P-channel pull-up devices. This imbalance produces a controlled voltage offset to the second stage of the sense amplifier, which causes a slight delay so that the dummy portion will not trigger until a voltage differential has developed between the complementary bit lines and all of the core array sense amplifiers have stabilized. Thus, the dummy bit line sensing circuit tracks the core array sense amplifier, yet further includes a built-in margin to assure that a false control signal will not trigger and terminate the access cycle prematurely. This tracking is important from a power dissipation and cycle time standpoint and is accomplished using a dummy sense amplifier being as identical as possible in design and layout as the core array sense amplifiers, but further including built-in margin to guarantee a worst case self-timing signal.

An array of data buffers are preferably provided to buffer the output data to the latches. In the preferred embodiment, these buffers are inverters. The timing signal at the output of the dummy sense amplifier is also provided through an inverter, which is biased to have a low voltage input switch point relative to the data buffers. In this manner, the timing inverter has a built-in margin offset and asserts an inverted timing signal at its output after the data buffers have stabilized. An additional delay device is preferably provided to assure that the latches have stabilized before the output data is latched.

The output of the inverter and delay device is used as the shut down timing signal, which feeds the control logic, which in turn latches the core memory array output data, turns off all the sense amplifiers, disables the word lines and puts the array back into a pre-charge state as soon as possible after detecting the assertion of the timing signal. At the completion of the access, the memory is placed in a static power condition awaiting a new access. In this manner, the entire cycle is initiated via a rising clock edge, and therefore is independent of any subsequent transitions of the external clock.

In the preferred embodiment, all of the sense amplifiers include a first level shifter stage and a second high gain differential amplifier stage. The first stage shifts the bit line voltage down from rail to optimize sensing in the second stage. The two stages together provide sensing at lower source voltages, even as low as 1.8 volts, since only a single threshold drop is required for operation thereby providing for maximum headroom.

It is now appreciated that a memory system according to the present invention overcomes many of the deficiencies of systems of prior art. The dummy path simulates the timing of the core array and also tracks the size of the array since its length is always proportional to the size of the array. The dummy sense amplifier is biased to include added timing margin to assure the timing signal is asserted after data is sensed by the core sense amplifier. Other delay logic, preferably including an inverter and a delay device, assures that the data is not latched until after the data latches have stabilized. Nonetheless, the timing signal is asserted to shut down the sense amplifier as soon as possible to minimize power consumption. Furthermore, the present invention is more reliable since the sense amplifiers are implemented with two stages including a level shifter stage, which operates even at very low voltages. Thus, if the supply voltage should fall below 2.0 volts, the sense amplifiers still operate correctly.

Other and further objects, features and advantages will be apparent from the following description of presently preferred embodiments of the invention, given for the purpose of disclosure and taken in conjunction with the accompanying drawings.

DETAILED DESCRIPTION OF THE PREFERRED EMBODIMENT

Figure 1:
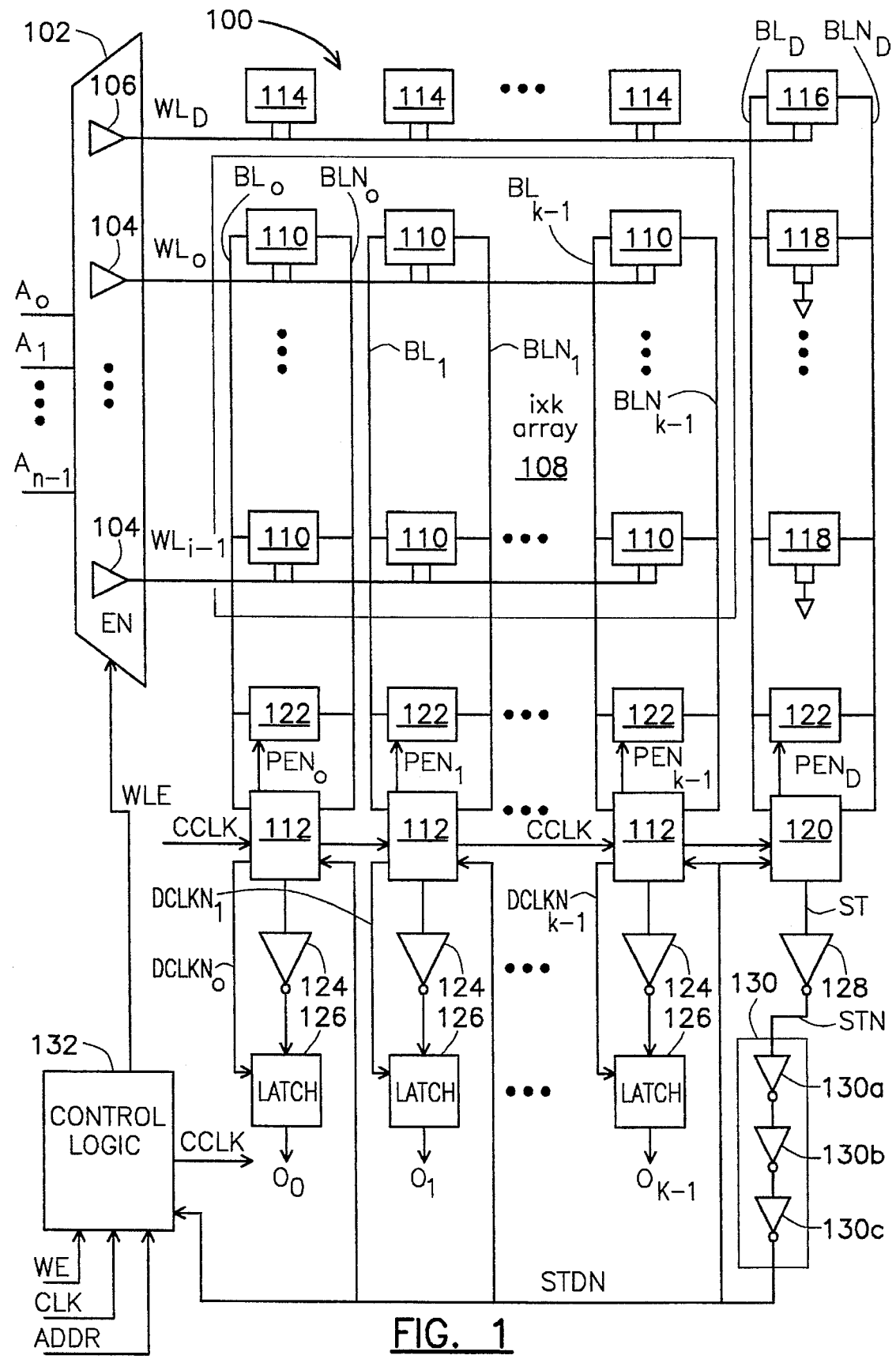
FIG. 1 is a simplified block diagram of a low power memory system according to one embodiment of the present invention.

Referring now to FIG. 1, a simplified block diagram is illustrated of a synchronous, low power memory system 100 implemented according to the present invention. A plurality of address signals, $A_0, A_1, \ldots A_{n-1}$, collectively referred to as the ADDR signals, are provided to the input of a word line decoder 102 for asserting a plurality of word line signals, $WL_0, WL_1, \ldots WL_{i-1}$. A plurality of word line drivers 104 are included within the word line decoder 102 for asserting the respective word line signals $WL_0$-$WL_{i-1}$ on corresponding word line conductors. A word line enable (WLE) signal is asserted by a control logic 132, described more fully below, where the word line decoder 102 decodes the ADDR signals to enable one of the drivers 104 to assert one of the $WL_0$-$WL_{i-1}$ signals in response.

The word line decoder 102 further includes a dummy word line driver 106, which asserts a dummy word line signal $WL_D$ on a dummy select line conductor during each memory access or read or write cycle in response to each assertion of the WLE signal. The $WL_0$-$WL_{i-1}$ lines are all provided to a memory array 108. The memory array 108 primarily includes an i by k array or matrix of core memory cells 110 organized as a series of i rows and k columns as known to those skilled in the art. The particular number of rows and columns depends upon the size of the memory array 108. For example, typical memory sizes are 32 words by 4 bits up to 4096 words by 72 bits, although the present invention is not limited to any particular memory array size. The $WL_D$ line is provided to a row of k dummy memory cells 114 aligned along the upper edge or top of the memory array 108.

Each column of the array of core memory cells 110 is coupled to a corresponding pair of complementary bit lines for carrying bit line signals $BL_j$ and $BLN_j$, which are further provided to a corresponding array of j sense amplifier and control circuits 112 distributed along the bottom edge of the memory array 108, where j is an integer from 0 to k−1. An "N" added to a signal name denotes negative or inverted logic. The $BL_j$ and $BLN_j$ complementary bit line signals are preferably initially precharged to a logic high voltage level, as described further below, where the voltage of the bit line signals separate depending upon the particular data bit being asserted. A logic 1 is represented as $BL_j$ remaining at a logic high and $BLN_j$ falling to a logic low. A logic 0 is represented by $BL_j$ falling to a logic low voltage level and $BLN_j$ remaining at a logic high. Each of the sense amplifier and control circuits 112 preferably includes a differential amplifier for detecting the separation of the corresponding $BL_j$, $BLN_j$ bit line signals. In this manner, only one of the $WL_0$-$WL_{i-1}$ signals is asserted in response to assertion of the WLE signal and the corresponding row of memory cells 110 is enabled for asserting data on the $BL_j$, $BLN_j$ signals, where the $BL_j$, $BLN_j$ signals are asserted by only one core memory cell at any given time. An "N" appended to the end of a signal name denotes negative logic, where the signal is considered asserted when low and deasserted when high.

Each of the dummy memory cells 114 is coupled to the $WL_D$ line for receiving the $WL_D$ signal, although the cells 114 are not coupled to the $BL_j$ and $BLN_j$ bit lines of the memory array 108. The row of dummy memory cells 114 further includes a fixed dummy memory cell 116 coupled to the $WL_D$ line, yet placed at the end of the row furthest from the dummy word line driver 106 and aligned with a column of i dummy memory cells 118. The column of dummy memory cells 118 is aligned along the right edge of the memory array 108, but are not coupled to the corresponding $WL_0$-$WL_{i-1}$ lines, but instead have their inputs effectively grounded. The fixed memory cell 116 and the dummy memory cells 118 are, however, all coupled to a corresponding pair of complementary dummy bit lines for carrying the $BL_D$, $BLN_D$ dummy bit line signals placed along the right side of the memory array 108, as illustrated in FIG. 1. The $BL_D$, $BLN_D$ signals are further coupled to a dummy sense amplifier and control circuit 120 aligned in the same row as the core memory sense amplifier and control circuits 112. The dummy memory cells 118 are entirely decoupled from memory array 108 with their word line inputs coupled to ground or otherwise disabled.

As described above, the row of dummy memory cells 114 are not coupled to the corresponding $BL_j$, $BLN_j$ bit lines of each corresponding column of core memory cells 110. However, the dummy memory cells 114 and the fixed memory cell 116 are all coupled to the $WL_D$ word line and include pass transistors (not shown) which apply gate capacitance and metal load to the $WL_D$ word line. In fact, the dummy cells 114 are implemented in substantially an identical manner as the core memory cells 110, except that they do not assert data. In this manner, the dummy row of memory cells 114 apply loading on the $WL_D$ word line to simulate the loading applied to each of the $WL_0$-$WL_{i-1}$ word lines.

Furthermore, the fixed memory cell 116 and the dummy cells 118 are all coupled to the $BL_D$, $BLN_D$ bit lines in the dummy column, but only the fixed memory cell 116 asserts data when enabled by the $WL_D$ signal. Thus, each of the dummy memory cells 118 apply loading to the $BL_D$, $BLN_D$ bit lines to simulate the loading applied to each of the $BL_j$, $BLN_j$ bit lines, although the dummy memory cells 118 do not assert data. The dummy cells 118 are preferably implemented identically to the core cells 110, and also include pass transistors to apply gate capacitance to the $BL_D$, $BLN_D$ bit lines.

In this manner, one of the $WL_0$-$WL_{i-1}$ core memory word line select signals is asserted for enabling a corresponding row of core memory cells 110 for driving the corresponding $BL_j$, $BLN_j$ bit line signals, which are further detected by the array of core memory sense amplifier and control circuits 112. During each memory access, the word line driver 106 asserts the $WL_D$ signal for enabling the fixed memory cell 116, which asserts the dummy bit line signals $BL_D$, $BLN_D$ to transmit a logic zero data bit to the dummy sense amplifier and control circuit 120.

As described above, each of the dummy memory cells 114, 116, and 118 are implemented in substantially identical design and layout as each of the core memory cells 110. In this manner, the delays of the $BL_D$, $BLN_D$ and $WL_D$ signals substantially simulate the delays of the $BL_j$, $BLN_j$ and $WL_0$-$WL_{i-1}$ signals, respectively. Nonetheless, since the fixed memory cell 116 is located furthest from the corresponding dummy word line driver 106 and since the dummy sense amplifier and control circuit 120 is located furthest from the fixed memory cell 116, the dummy path is a marginally longer path than the longest path of the memory array 108, thereby representing the worst case timing of the memory array 108, since it tracks or is otherwise proportional to the size of the memory array 108. In this manner, the dummy path as implemented is typically the slowest path, but its timing is also proportionate to the size of the memory array 108 due to its physical positioning relative to the core memory cells 110.

An array of precharge pull-up devices 122 are provided, each coupled to a corresponding one of the BL and BLN bit lines, where BL, BLN collectively refers to the $BL_j$, $BLN_j$ and the $BL_D$, $BLN_D$ bit lines. Each precharge device 122 receives a respective precharge enable signal $PEN_j$ from a corresponding one of the sense amplifier and control circuits 112 and 120, and responds by charging all of the BL, BLN signals high. The precharge signal from the dummy sense amplifier and control circuit 120, shown as a signal $PEN_D$, operates in an identical manner as the other $PEN_j$ signals, so that it will be considered included as one of the $PEN_j$ signals referenced herein. In the preferred embodiment, the $PEN_j$ signals are asserted low to enable the precharge devices 122 in between memory accesses. Thus, prior to each access of the memory array 108, all of the BL, BLN bit line signals are precharged high. The $PEN_j$ signals are then deasserted high prior to a memory access, allowing the corresponding memory cells 110 or 116 to assert corresponding data on the corresponding BL, BLN bit lines.

The respective outputs of the array of sense amplifier and control circuits 112 are provided to the respective inputs of an array of corresponding inverter-buffers 124, which have their outputs coupled to the respective inputs of an array of corresponding latches 126. The array of latches 126 assert output signals to an inverting buffer array (not shown) which assert output signals $O_0, O_1, \ldots O_{k-1}$. For purposes of simplicity, the array of latches and inverting buffers are shown as the array of latches 126. Thus, the $O_0$–$O_{k-1}$ output signals reflect the respective outputs of the sense amplifier and control circuits 112. Each of the latches 126 are transparent when respective output latch or clock signals $DCLKN_0$-$DCLKN_{k-1}$, otherwise referred to as the $DCLKN_j$ signals, are asserted low, so that any data asserted by the corresponding inverters 124 is provided on the $O_0$–$O_{k-1}$ output signals. When the $DCLKN_j$ signals are deasserted high, however, the latches 126 are closed and thus latch the data asserted by the inverters 124 to assert static $O_0$–$O_{k-1}$ output signals.

The output of the dummy sense amplifier and control circuit 120 asserts a self-timing signal ST, which is provided to the input of an inverter 128, which asserts an inverted self-timing signal STN. The STN signal is preferably provided to the input of an inverting delay device 130, which asserts a self-timing signal STDN to the all of the sense amplifier and control circuits 112 and 120 and to the control logic 132. The delay device 130 is preferably implemented by a series of inverters 130a, 130b and 130c, which are each configured to provide any desired delay.

Operation of the memory system 100 is now described. In an initial condition prior to a memory access, the ST and STDN signals are both initially precharged high and the CCLK signal is low. The sense amplifier and control circuits 112, 120 are disabled and the latches 126 are closed. The control logic 132 receives the CLK signal from external logic (not shown), latches the ADDR address signals and initiates a memory access by asserting a signal CCLK to the sense amplifier and control circuits 112 and 120. The sense amplifier and control circuits 112 and 120 receive the CCLK signal and deassert the $PEN_j$ signals to disable the precharge devices 122, and also disable precharge devices coupled to respective outputs of each of the sense amplifier and control circuits 112 and 120, as further described below. The sense amplifier and control circuits 112 assert the $DCLKN_j$ signals low to cause the latches 126 to be transparent for detecting the data provided by internal sense amplifiers, described below. The control logic 132 also asserts the WLE signal to enable the word line decoder 102 to decode the ADDR signals. One of the word line drivers 104 asserts a corresponding word line enable signal and the word line driver 106 asserts the $WL_D$ signal.

For a read cycle, a corresponding row of core memory cells 110 is enabled for asserting data on the corresponding $BL_j$, $BLN_j$ bit lines in response to one of the $WL_0$-$WL_{i-1}$ signals being asserted. For a write cycle, a row of write data buffers (not shown) assert data on the $BL_j$, $BLN_j$ bit lines, where the data is written into the accessed memory cells 110. A write enable signal, referred to as a signal WE, is provided to the control logic 132 to indicate a write cycle, where corresponding write enable signals (not shown) are provided to the sense amplifier and control circuits 112. However, since operation is similar for both the read and write cases, the write signals are not shown and read and write memory access are simply referred to as memory accesses.

It is noted that the dummy path always performs a read cycle for all read and write memory accesses. Since the $BL_j$, $BLN_j$ bit lines are actively driven by the write data buffers during a write cycle, the sense amplifier and control circuits 112 sense the data relatively quickly as compared to a read cycle. Since it is desired that the dummy path perform according to the worst or longest case memory access, the read cycle timing is the more critical timing case.

For either memory access case, the sense amplifier and control circuits 112 sense the corresponding data bits and assert data to the inverters 124, which assert inverted data to the array of latches 126. The latches 126 correspondingly provide output data signals $O_0$–$O_{k-1}$ at their respective outputs, after any delay through the latches 126. Simultaneously, the dummy word line driver 106 asserts the $WL_D$ signal and the fixed memory cell 116 correspondingly asserts the $BL_D$ dummy bit line signal low after sensing the $WL_D$ signal asserted. Once again, the dummy memory cells 114 and 118 do not assert data, but are coupled for loading the $WL_D$ word line and the $BL_D$, $BLN_D$ bit lines. The dummy sense amplifier and control circuit 120 senses the $BL_D$, $BLN_D$ signals and correspondingly asserts the ST signal low in response to the logic zero read from the fixed memory cell 116. The inverter 128 correspondingly asserts the STN signal high and eventually the delay device 130 asserts the STDN signal low, which is detected by the sense amplifier and control circuits 112 and 120 and the control logic 132.

In response to the STDN signal being asserted low, the sense amplifier and control circuits 112 determine that the memory access has been completed and correspondingly assert the DCLKN$_j$ signals, so that the array of latches 126 latch the O$_0$-O$_{k-1}$ output signals. The sense amplifier and control circuits 112 and 120 also reassert the PEN$_j$ signals to enable the precharge devices 122 for the next memory access cycle. The sense amplifiers within the sense amplifier and control circuits 112 and 120 are also disabled and precharged. The control logic 132 further deasserts the WLE signal to disable the word line decoder 102. In this manner, once the STDN signal is asserted low, the latches 126 latch the output data and the memory array 108 is placed back into a precharge state as soon as possible to prepare for the next memory access.

It is noted that the control logic 132 initiates the entire memory access on the rising edge of the CLK signal, and that the cycle is effectively terminated on the falling edge of the delayed self-timing STDN signal rather than having to wait for a subsequent transition on the CLK signal. In this manner, the timing is not dependent upon the particular duty cycle of the CLK signal and is thus based on a single clock transition. Thus, there are no duty cycle constraints on the CLK clock signal. Because the fixed memory cell 116 is placed furthest from the dummy word line driver 106 and because the dummy sense amplifier and control circuit 120 is placed furthest from the fixed memory cell 116, the dummy path represents the longest physical path of the memory array 108. Nonetheless, since the dummy path corresponds to the size of the memory array 108, the timing of the dummy path corresponds to the size of the memory array 108. In this manner, the dummy path timing effectively tracks the size of the memory array 108, regardless of its size.

As described further below, the dummy sense amplifier and control circuit 120 is modified relative to the core memory sense amplifier and control circuits 112 for providing a built-in margin to effectively ensure that the ST signal is asserted after the sense amplifier and control circuits 112 assert corresponding data signals at their outputs. Furthermore, the parameters of the inverter 128 are modified relative to the parameters of the inverters 124 for adding increased margin to ensure that the inverter 128 is not toggled until after the inverters 124 have stabilized. Finally, the delay device 130 provides an extra level of delay and buffering to ensure that the data latches 126 are stabilized prior to the STDN signal being asserted. These added margins effectively ensure that the O$_0$–O$_{k-1}$ output signals of the latches 126 are stabilized before being latched. It is noted that the parameters of the dummy sense amplifier and control circuit 120, the inverter 128 and the delay device 130 provide at least three stages of buffering, where each stage adds a delay of approximately 0.1–0.2 nanosecond (ns) to ensure the appropriate amount of delay.

Figure 2:
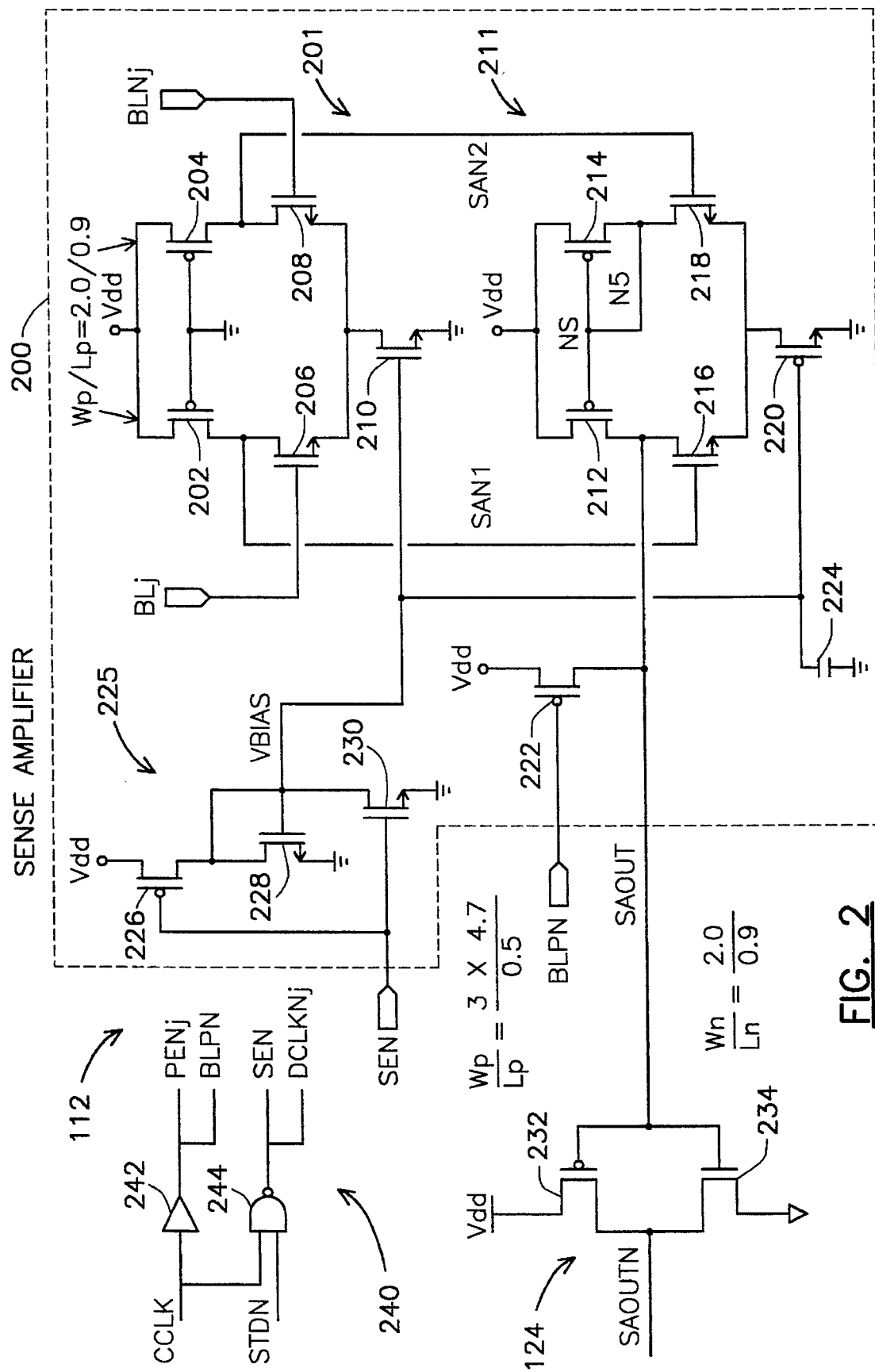
FIG. 2 is a schematic diagram of a core memory sense amplifier coupled to an output buffer-inverter of FIG. 1.

Referring now to FIG. 2, a schematic diagram is illustrated of one of the core memory sense amplifier and control circuits 112 further connected to a corresponding inverter 124. The sense amplifier and control circuit 112 includes a sense amplifier 200 and control logic 240. The sense amplifier 200 has two stages, including a level shifter stage 201 receiving the BL$_j$ and BLN$_j$ signals for asserting output signals SAN1 and SAN2, and a differential amplifier stage 211 receiving the SAN1 and SAN2 signals for asserting an output signal SAOUT. In the level shifter stage 201, the corresponding BL$_j$ signal is provided to the gate of an N-channel complementary metal-oxide semiconductor (CMOS) transistor 206, having its drain providing the SAN1 signal and its source connected to the drain of another N-channel CMOS transistor 210. The BLN$_j$ signal is provided to the gate of an N-channel CMOS transistor 208, having its drain providing the SAN2 signal and its source connected to the drain of the CMOS transistor 210. The source of the CMOS transistor 210 is connected to ground and receives a bias signal referred to as VBIAS. The VBIAS signal is developed by a separate bias circuit 225, described further below.

A source voltage signal, referred to as V$_{dd}$, is provided to the sources of two pull-up P-channel CMOS transistors 202 and 204, each having their gates connected to ground. The V$_{dd}$ signal is preferably 5 V, but may also be 3 volts or even as low as 1.8 volts in the preferred embodiment. The drain of the CMOS transistor 202 is connected to the drain of the CMOS transistor 206 and the drain of the CMOS transistor 204 is connected to the drain of the CMOS transistor 208.

The SAN1 signal is provided to the gate of an N-channel CMOS transistor 216 within the differential amplifier stage 211. The drain of the CMOS transmitter 216 provides the SAOUT output signal of the sense amplifier 200. The source of the CMOS transistor 216 is provided to the drain of another N-channel CMOS transistor 220, having its source connected to ground and its gate receiving the VBIAS signal, which is filtered by a capacitor 224 to ground. The V$_{dd}$ signal is provided to the source of two pull-up P-channel CMOS transistors 212 and 214, where the drain of the CMOS transistor 212 is connected to the drain of the CMOS transistor 216, and where the drain of the CMOS transistor 214 is connected to the drain of the CMOS transistor 218 and also to both gates of the CMOS transistors 212 and 214. The gates of the CMOS transistors 212 and 214 are referred to as a node N5. A signal BLPN, generated by the control logic 240, is provided to the gate of a P-channel CMOS transistor 222, having its source pulled high to the V$_{dd}$ signal and its drain connected to the SAOUT node for precharging the SAOUT signal when the BLPN signal is asserted low.

A signal SEN is provided to the gate of an N-channel CMOS transistor 230 and to the gate of a P-channel CMOS transistor 226 within the bias circuit 225. The source of the CMOS transistor 226 is pulled high to the V$_{dd}$ signal and its drain provides the VBIAS signal, which is provided to the drain and gate of another N-channel CMOS transistor 228 and to the drain of the CMOS transistor 230. The source of the CMOS transistor 228 is connected to ground.

The SAOUT signal is provided to the input of the inverter 124, which is implemented using a pull-up P-channel CMOS transistor 232 and a pull-down N-channel CMOS transistor 234. In particular, the SAOUT signal is provided to both gates of the CMOS transistors 232 and 234, both having their drains connected together for asserting an output signal SAOUTN. The source of the CMOS transistor 232 is pulled high to V$_{dd}$ and the source of the CMOS transistor 234 is connected to ground.

The width-to-length ratio (W$_P$/L$_P$) of both of the P-channel CMOS transistors 202 and 204 are preferably set to 2.0/0.9. The W$_P$/L$_P$ ratio of the P channel CMOS transistor 232 is preferably set to 3×4.7/0.5. The width-to-length (W$_N$/L$_N$) ratio of the N-channel CMOS transistor 234 is preferably set to 2.0/0.9. The effect of these ratios is described further below, especially in comparison to a dummy bit line sense amplifier 300 within the dummy sense amplifier and control circuit 120, described in FIG. 3.

The control logic 240 includes a buffer 242 receiving the CCLK signal and providing the respective PEN$_j$ signal and also providing the BLPN signal. The PEN$_j$ and BLPN signals are essentially the same, but have separate names indicating their respective functions. In particular, the $PEN_j$ signal is used to precharge a corresponding one of the precharge devices 122, whereas the BLPN signal is used to precharge the output of the sense amplifier 200. The CCLK signal is also provided to one input of a two-input NAND gate 244, which receives the STDN signal at its other input. The NAND gate 244 asserts both the SEN and $DCLKN_j$ signals at its output. Once again, the SEN and $DCLKN_j$ signals are effectively the same signals, but are differently named to indicate their respective functions.

The operation of the sense amplifier and control circuit 112 is now described. The CCLK signal is initially deasserted low and the STDN signal is initially deasserted high, so that the SEN signal is deasserted high for grounding the VBIAS signal through the CMOS transistor 230. The CMOS transistors 210 and 220 are turned off for disabling the sense amplifier 200. The corresponding $DCLKN_j$ signal is deasserted high, so that the corresponding one of the latches 126 is closed. In the initial state, the BLPN signal is asserted low for turning on the CMOS transistor 222 to pull the SAOUT signal high to the $V_{dd}$ signal to precharge the output of the sense amplifier 200. Further in the initial state, the $PEN_j$ signal is asserted low, so that the $BL_j$, $BLN_j$ signals are both precharged high, which turns the CMOS transistors 206 and 208 on. In the initial state, therefore, the sense amplifier 200 consumes little or no power since the CMOS transistors 210, 220 are turned off, thereby removing the path to ground.

When the CCLK signal is asserted high to initiate a memory access, the $PEN_j$ and BLPN signals are deasserted, so that the respective precharge device 122 and the CMOS transistor 222 are both disabled. The $DCLKN_j$ signal is asserted low by the NAND gate 244 to open the respective one of the latches 126. The SEN signal is also asserted low by the NAND gate 244, so that the VBIAS signal is pulled high to a level determined by the ratio of drain-to-source resistances between the CMOS transistors 226 and 228, which effectively turns on the CMOS transistors 210 and 220 to enable the sense amplifier 200. This establishes a relatively balanced path between the CMOS transistors 202, 206 and 210 and the transistors 204, 208 and 210 for asserting the SAN1 and SAN2 signals to approximately the same voltage level while the $BL_j$, $BLN_j$ signals both remain high.

The initial voltage levels of the SAN1 and SAN2 signals are a matter of design choice, but are preferably approximately in the center of the range between the $V_{dd}$ signal and ground for partially activating the CMOS transistors 216 and 218. A voltage divider path is established between the CMOS transistors 214, 218 and 220 for establishing an initial level at the N5 node and to establish an intermediate level of the SAOUT signal while the $BL_j$, $BLN_j$ signals remain asserted high. It is noted that this new level of the SAOUT signal is preferably towards the higher end of the voltage range of the $V_{dd}$ signal. In this manner, the SAOUT signal is initially charged to a high voltage level, but begins to drop after the BLPN signal is deasserted high and the SEN signal is asserted low.

If the corresponding core memory cell 110 or write data buffer asserts a zero on the $BL_j$, $BLN_j$ bit line signals, then the $BL_j$ signal begins to drop after the core memory cell 110 is enabled. This correspondingly begins turning off the CMOS transistor 206, pulling the SAN1 signal above the SAN2 signal. The CMOS transistor 216 begins to turn fully on, tending to ground the SAOUT signal to a logic low level through the transistors 216 and 220. In this manner, if the $BL_j$ signal is pulled low, indicating a logic 0, the SAOUT signal falls to a low voltage level to assert a logic 0.

On the other hand, if the corresponding core memory cell 110 or write data buffer asserts a logic 1, then the voltage of the $BLN_j$ signal begins to fall, turning off the CMOS transistor 208. The SAN2 signal increases relative to the SAN1 signal, thereby turning on the CMOS transistor 218. The voltage at the N5 node is pulled lower, thereby tending to turn on the CMOS transistor 212, keeping the SAOUT signal high through the $V_{dd}$ signal. Thus, the $BLN_j$ signal being asserted low to indicate a logic 1 causes the SAOUT signal to remain high once the sense amplifier 200 is enabled.

The inverter 124 is preferably biased to have a relatively high voltage switching point at its input, so that its output favors a high logic level. In particular, the $W_P/L_P$ ratio of the P-channel CMOS transistor 232 is preferably set to 3×4.7/0.5, so that its drain-to-source resistance is relatively small compared to the N-channel CMOS transistor 234, which has its $W_N/L_N$ ratio equal to 2.0/0.9. The SAOUTN signal is initially asserted low since the SAOUT signal is precharged high. As the SAOUT signal begins to fall, it quickly reaches the relatively high logic voltage switch point of the inverter 124 since the CMOS transistor 232 turns on faster than the CMOS transistor 234 turns off. Thus, the SAOUTN signal rises relatively quickly in response to the SAOUT signal falling. It is further noted that, although the SAOUT signal begins to fall and possibly switches the inverter 124, the $BLN_j$ signal falling low in response to reading a logic 1 causes the SAOUT signal to reverse and go back high, thereby re-switching the inverter 124. In summary, the sense amplifier 200 is precharged high and begins to settle to an intermediate state before being asserted to the high or low logic level. The inverter 124 has its output initialized low, but is biased to favor a high output.

The level shifter stage 201 provides a relatively small gain and shifts the voltages of the $BL_j$, $BLN_j$ signals down from rail ($V_{dd}$) to optimize sensing in the differential amplifier stage 211. The differential amplifier stage 211 is preferably a high gain amplifier. The two stages 201, 211 together provide sensing at low voltage levels of the $V_{dd}$ signal since only a single threshold drop is required for operation, thereby providing for maximum headroom. Thus, the sense amplifier 200 operates at voltages as low as 1.8 volts for correct operation, including supply voltages of 1.8, 2.0, 2.4 or 3.0 volts or higher. Thus, $V_{dd}$ may drop as low as 1.8 volts and proper operation is still maintained.

Figure 3:
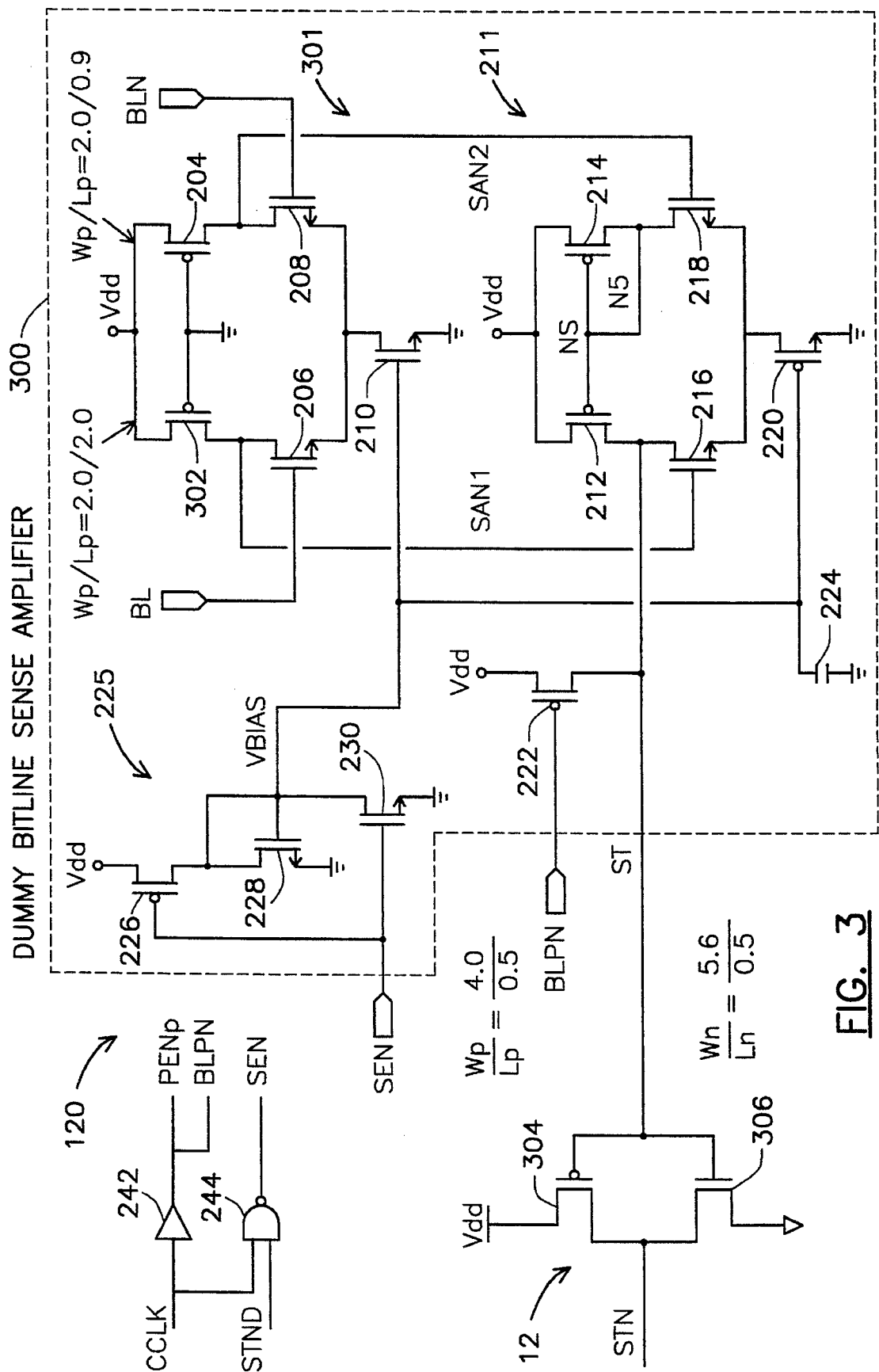
FIG. 3 is a schematic diagram of the dummy sense amplifier coupled to a corresponding buffer-inverter of FIG. 1.

Referring now to FIG. 3, a schematic diagram is shown illustrating the dummy sense amplifier and control circuit 120 coupled to the inverter 128. The dummy sense amplifier and control circuit 120 includes a dummy sense amplifier 300 and control logic 340, and is implemented in design and layout in an almost identical manner as each of the core sense amplifier and control circuits 112. Similar components assume identical reference numerals. Within the dummy sense amplifier 300, however, the $BL_D$, $BLN_D$ bit lines are connected to a slightly modified level shifter stage 301, in which the CMOS transistor 202 (FIG. 2) is replaced by a different P-channel CMOS transistor 302 having a modified $W_P/L_P$ ratio of 2.0/2.0. Increasing the channel length of a CMOS transistor effectively increases its drain-to-source resistance, so that the SAN1 signal is initially asserted at a lower voltage level relative to the analogous SAN1 signal of the sense amplifier 200 when the SEN signal is asserted. The differential amplifier stage 211 of the dummy sense amplifier 300 is implemented exactly the same way as is the sense amplifier 112, but its output asserts the self-timing signal ST.

The lower voltage of the SAN1 signal tends to turn on the CMOS transistor 216 less than the CMOS transistor 216 in the sense amplifier 200, which causes the dummy sense amplifier 300 to keep the ST signal asserted high for a longer period of time. Thus, the self-timing signal ST at the output of the dummy sense amplifier and control circuit 120 is initially precharged high and is biased to stay high for a longer period of time than the corresponding output signal SAOUT of each of the sense amplifier and control circuits 112.

As described previously, the fixed memory cell 116 is hard-wired to always assert a logic 0, so that it always asserts the $BL_D$ signal low once enabled by the $WL_D$ signal. In this manner, the $BL_D$ signal provided to the dummy sense amplifier and control circuit 120 always falls low, turning off the CMOS transistor 206, increasing the SAN1 signal to correspondingly turn on the CMOS transistor 216. However, the increased biasing of the pull-up CMOS transistor 302 increases the amount of voltage that the $BL_D$ signal must drop before turning on the CMOS transistor 216 to pull the ST signal low. In this manner, the ST signal is initially precharged high and is always eventually asserted low by the dummy sense amplifier 300 in response to being enabled. The modification of the CMOS transistor 302 preferably adds approximately 0.1 to 0.2 ns of delay before the ST signal is asserted low as compared to the SAOUT signal at the output of the sense amplifier 300. In this manner, the ST signal is generally not asserted until after the SAOUT output signals of the array of sense amplifier and control circuits 112 have all stabilized.

The inverter 128 includes a P-channel CMOS transistor 304, having its source coupled to the $V_{dd}$ signal and its drain coupled to the drain of another N-channel CMOS transistor 306. The CMOS transistors 304, 306 both have their gates connected together for receiving the ST signal and their drains connected together, providing an output signal STN. The source of the CMOS transistor 306 is connected to ground. However, the respective parameters of the inverter 128 are relatively more balanced than the corresponding parameters of the inverter 124. In particular, the $W_P/L_P$ ratio of the CMOS transistor 304 is preferably 4.0/0.5 and the $W_N/L_N$ ratio of the CMOS transistor 306 is preferably 5.6/0.5. Thus, the drain-to-source resistance of the CMOS transistor 304 is substantially increased relative to the analogous CMOS transistor 232, and the drain-to-source resistance of the CMOS transistor 306 is decreased relative to the analogous CMOS transistor 234 of the inverter 124. In this manner, the inverter 128 is biased to have a relatively low logic voltage switching point at its input since the CMOS transistor 306 tends to dominate or switch faster than the CMOS transistor 304. As described previously, the ST signal is initially precharged high so that the STN signal is initially asserted low. When the ST signal eventually falls, it must fall to the low switching voltage before the inverter 128 asserts the STN signal high due to the relative biasing of the CMOS transistors 304 and 306. This adds an additional level of delay between the ST and STN signal of approximately 0.1–0.2 ns as compared to the delay between the SAOUT and SAOUTN signals through the inverter 124. This added delay further ensures that the output of the inverter 128 lags behind all of the outputs of the array of inverters 124.

The control logic 340 is very similar to the control logic 240, and includes a buffer 342 receiving the CCLK signal and providing the $PEN_D$ and BLPN signals. The CCLK signal is provided to one input of a two-input NAND gate 344, which receives the STDN signal at its other input. The NAND gate 344, however, only asserts both the SEN for the sense amplifier 300, where a $DCLKN_j$ signal is not required.

The inverting delay device 130 provides an additional buffer delay to account for delays through the array of output latches 126. The delay device 130 may be implemented in any fashion known to those skilled in the art, such as the three series-coupled inverters 130a, 130b, 130c as illustrated. The parameters of the series-coupled inverters 130a, 130b and 130c are adjusted in a similar manner as the inverters 124 and 128, described above, to effectively provide any desired amount of delay through the delay device 130 to account for delays through the array of latches 126. In the preferred embodiment, the delay device 130 inserts approximately 0.1–0.2 ns or more of delay from the STN signal to the STDN signal. In this manner, the STDN signal is asserted low after all of the $O_0$–$O_{k-1}$ output signals of the latches 126 have stabilized.

Figure 4:
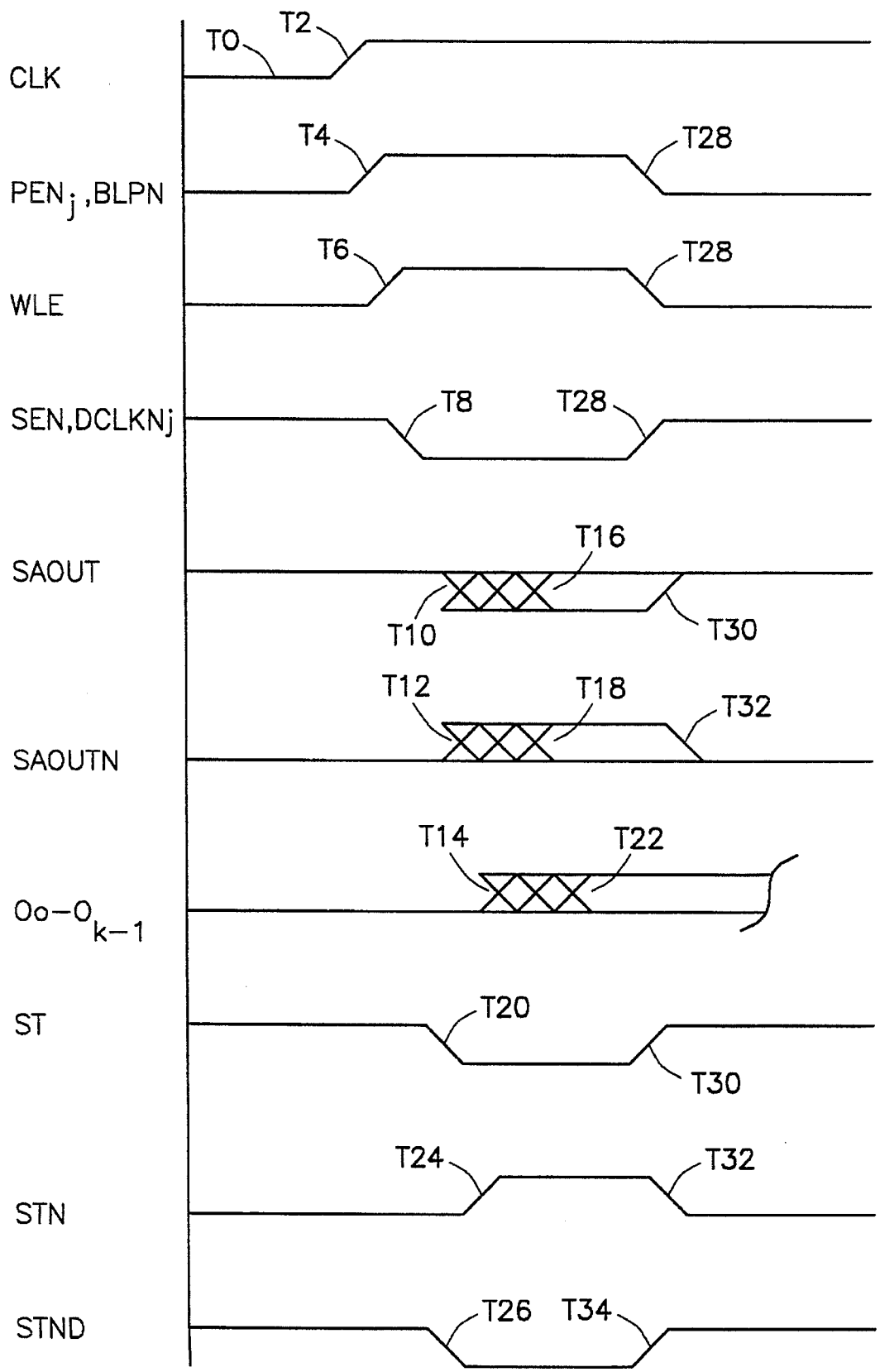
FIG. 4 is a timing diagram illustrating operation of the memory system of FIG. 1.

FIG. 4 is a timing diagram illustrating operation of the memory system 100. At an initial time T0, the CLK signal is initially deasserted low. The $PEN_j$ and BLPN signals are asserted low to precharge the BL, BLN signals high and to precharge the SAOUT and ST signals high. The STDN signal is also initially deasserted high. The WLE signal is initially deasserted low. The memory array 108 is thus precharged and ready for a memory access. External logic monitors the ADDR signals and other control signals (not shown) for determining when a memory access is desired. After the ADDR address signals have stabilized, the external logic asserts the CLK signal to the control logic 132 at time T2 to initiate a memory access.

In response to the assertion of the CLK signal, the control logic 132 asserts the CCLK signal, and the sense amplifier and control circuits 112, 120 deassert the $PEN_j$ and BLPN signals at a time T4 to release the precharge devices 122 and the outputs of the sense amplifier and control circuits 112, 120. The control logic 132 then asserts the WLE signal at time T6. The WLE signal enables the word line decoder 102, where the drivers 104, 106 correspondingly assert one of the $WL_0$-$WL_{i-1}$ signals and the $WL_D$ signal, respectively. The sense amplifier and control circuits 112, 120 assert the SEN and $DCLKN_j$ (if applicable) signals at a time T8, where the respective SEN signals enable the sense amplifiers 200, 300, which correspondingly begin sensing the pairs of complementary bit lines for asserting the SAOUT and ST signals, respectively. The $DCLKN_j$ signals open the array of latches 126 at time T8.

The core memory cells 110 in the enabled row asserts data on the corresponding $BL_j$, $BLN_j$ signals, and the fixed memory cell 116 asserts the $BL_D$ signal low. The SAOUT signals change beginning at time T10 and finally stabilize at approximately time T16. However the ST signal remains high until after time T16 and is finally asserted low at a subsequent time T20. Thus, due to the maximum data path through the dummy row and column and due to the added margin in the dummy sense amplifier and control circuit 120, the ST signal is asserted after the SAOUT signals have stabilized.

The SAOUTN signals finally stabilize at a time T18 after the SAOUT signals stabilize because of the delays through the inverters 124. Due to added margin in the inverter 128, the STN signal is not asserted high until a subsequent time T24 after the time T18. Furthermore, the output signals $O_0$–$O_{k-1}$ finally stabilize at a time T22 after delays through the latches 126, where the delay device 130 asserts the STDN signal low at a subsequent time T26. The delay device 130 thus ensures that the STDN signal is not asserted low until all of the output signals $O_0$–$O_{k-1}$ have stabilized.

After a slight delay through the NAND gates 244, 344 after the STDN signal is asserted low, the SEN and $DCLKN_j$ signals are deasserted at time T28, where the data in the latches 126 is latched to capture the output signals $O_0$–$O_{k-1}$. Also, after a slight delay through the buffers 242, 244, the PEN and BLPN signals are reasserted low at about time T28 to precharge the bit lines and outputs signals to prepare for the next memory access. Further, the control logic 132 deasserts the WLE signal low at time T28. The SAOUT and ST signals are precharged high at about time T30, and the SAOUTN and STN signals go low at time T32. Finally, the STND signal is deasserted at a subsequent time T34.

Because of the added margins programmed into the dummy sense amplifier 300, the inverter 128 and the delay device 130, the outputs of the latches 126 are effectively guaranteed to be stable prior to the STDN signal being asserted to indicate completion of the memory access of the memory array 108. First, the relative position of the dummy row and dummy column ensures that the $BL_D$ and $BLN_D$ dummy bit line signals are provided to the dummy sense amplifier 300 after the remaining core memory sense amplifiers 200 have stabilized. Further, the margin designed into the dummy sense amplifier 300 assures that the ST signal is slightly delayed relative to the outputs of the core sense amplifiers 200. Third, the added margin in the inverter 128 ensures that its output is delayed relative to the array of data inverters 124. The delay device 130 ensures that the STDN signal is delayed relative to the output signals $O_0$–$O_{k-1}$.

Figure 5:
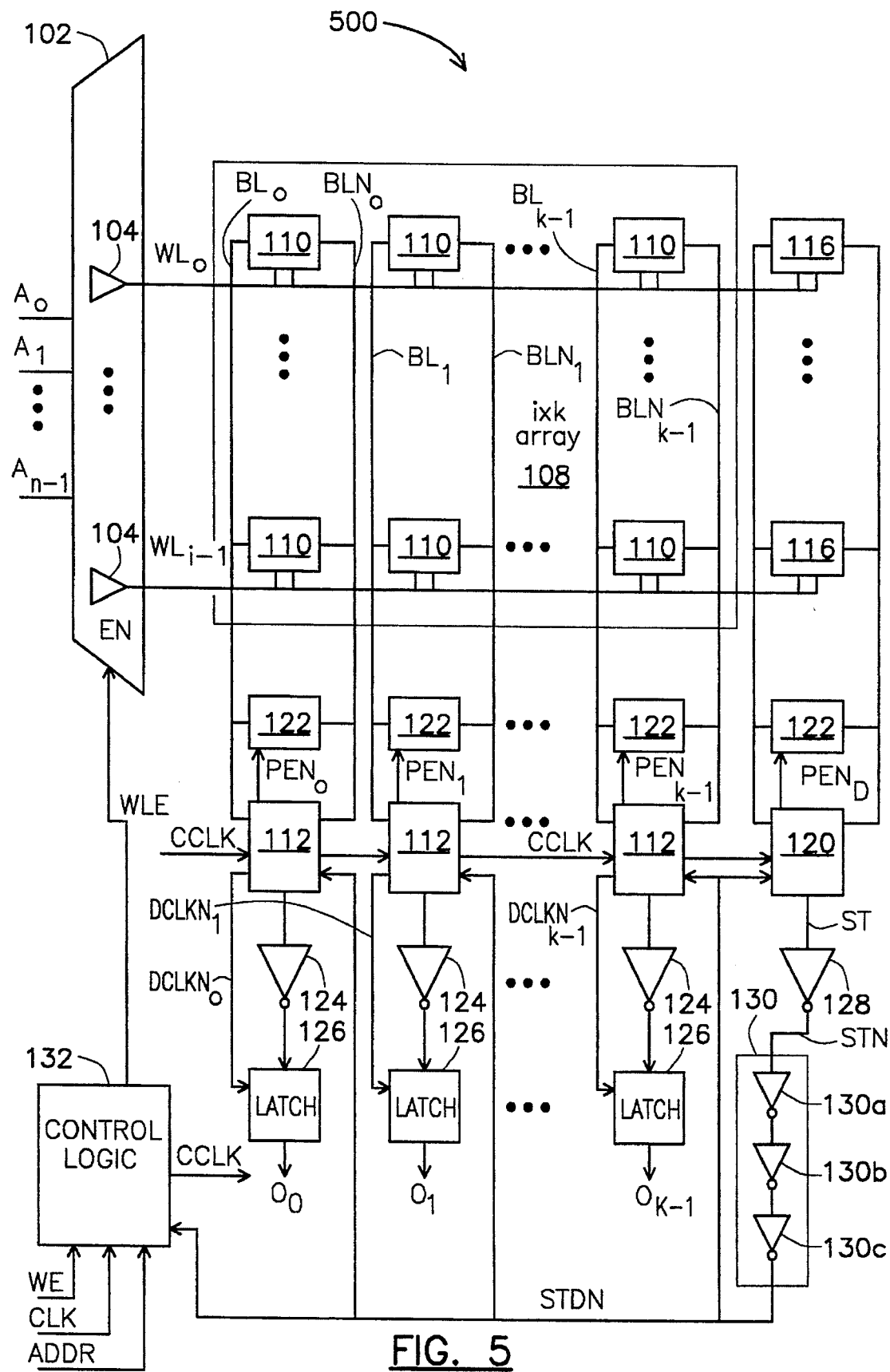
FIG. 5 is a simplified block diagram of a low power memory system according to an alternative embodiment of the present invention.

FIG. 5 is a simplified block diagram of a low power memory system 500 according to an alternative embodiment of the present invention. The memory system 500 is similar to the memory system 100, except that row and column of dummy memory cells 114, 118 and the single fixed dummy memory cell 116 are not included. Also, the word line driver 106 is also not provided within the word line decoder 102. The $WL_0$-$Wl_{i-1}$ word lines are connected to the inputs of a column of fixed dummy cells 116, each of which act in a similar manner as the fixed memory cell 116 of the memory system 100. In particular, the dummy memory cells 118 in FIG. 5 are fixed and always assert a logic zero when enabled by the corresponding $WL_0$-$Wl_{i-1}$ word line signals.

The memory system 500 is preferred over the memory system 100 in many designs since the timing or dummy bit line tracking is even closer than when the dummy word line of the memory system 100 is used. Furthermore, the memory area is reduced by the width of one row, reducing the size and possibly the cost of the memory system 500 as compared to the memory system 100. However, the memory system 100 is preferred in cases where a non-even power of two (2) addressing occurs, which means that there are fewer physical rows than are possible given the number of external row address pins. If a non-even power of two (2) addressing is used, then if an access occurs for an address beyond the physical address space in the memory system 500, the access cycle is initiated, but no word line is enabled in the core array. In this manner, there is no dummy path to terminate the cycle. Thus, in cases where a non-even power of two (2) addressing occurs, the memory system 100 ensures that a dummy word line is enabled to terminate the cycle if an incorrect address is provided.

It is now appreciated that a memory system including a memory control system according to the present invention overcomes many of the disadvantages of prior art systems. A dummy path is included along adjacent edges of the core array to provide a self-timing signal, which tracks the size of the array. This is particularly advantageous for memory compiler applications since the timing is minimized regardless of the size of the array. Timing margins are added in the dummy path and sense amplifier to assure that the cycle is not terminated prematurely. Further margins are added to assure that data is stable before being latched. Thus, the sense amplifiers are turned off as soon as possible to save power but not too soon to compromise data integrity. Furthermore, the sense amplifiers include two stages to ensure proper operation even at low source voltages, even as low as 1.8 volt.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection and arrangement has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A self-timed memory control system for accessing data in a memory system in response to the assertion of a clock signal, the memory system including a core memory array with rows and columns of core memory cells, a corresponding array of sense amplifiers receiving a sense enable signal for enabling the sense amplifiers to sense output data in the core memory cells and for disabling the sense amplifiers, and a corresponding array of latches for latching the sensed output data, said control system comprising:

control logic for asserting a word line enable signal and the sense enable signal in response to the assertion of the clock signal, and for deasserting the sense enable signal and asserting a latch signal to latch the sensed output data in response to subsequent assertion of a timing signal;

a dummy word line driver for asserting a dummy word line select signal on a dummy select line in response to each assertion of said word line enable signal;

a dummy row and dummy column of memory cells located on two adjacent outer edges of the core memory array for mirroring the rows and columns of the core memory cells, wherein each memory cell of said dummy row is coupled to load said dummy select line and wherein each memory cell of said dummy column is coupled to load a pair of complementary dummy bit lines, said dummy row and dummy column further including a fixed memory cell located at the intersection of said dummy row and dummy column on an opposite end of said dummy row as said dummy word line driver, wherein said fixed cell is coupled to said dummy select line to receive said dummy word line select signal and to respondingly assert a predetermined logic level on said pair of complementary dummy bit lines; and a dummy sense amplifier coupled to said pair of complementary dummy bit lines at an opposite end of said dummy column as said fixed dummy memory cell for sensing said predetermined logic level and for respondingly asserting said timing signal, said dummy sense amplifier being biased to favor an opposite logic level of said predetermined logic level for adding timing margin.

2. The memory control system of claim 1, wherein each memory cell of said dummy row and dummy column is implemented with substantially the same design and layout as the core memory cells for applying similar loading.

3. The memory control system of claim 1, wherein each column of core memory cells of the memory array is coupled to a corresponding pair of complementary bit lines, further comprising:

an array of precharge amplifiers receiving a precharge enable signal for precharging the pair of complementary bit lines for each column of the core memory array including said pair of complementary dummy bit lines; and wherein said control logic asserts said precharge enable signal while the clock signal is deasserted and deasserts said precharge enable signal in response to the assertion of the clock signal.

4. The memory control system of claim 3, wherein said dummy sense amplifier comprises:

a level shifter coupled to said pair of complementary dummy bit lines; and a differential amplifier coupled to said level shifter for providing said timing signal.

5. The memory control system of claim 4, wherein said level shifter comprises:

first and second pull-up devices coupled to a source voltage; and first and second pull-down devices coupled between said first and second pull-up devices, respectively, and ground, wherein said first pull-down device receives a positive bit line signal and said second pull-down device receives a negative bit line signal;

wherein said first pull-up device is biased to have a greater voltage margin than said second pull-up device so that a greater voltage differential occurs between said positive and negative bit line signals before said differential amplifier is switched.

6. The memory control system of claim 5, wherein said first and second pull-up devices comprise P-channel CMOS transistors, said first and second pull-down devices comprise N-channel CMOS devices and wherein said first pull-up device has a lower width to length ratio than said second pull-up device.

7. The memory control system of claim 3, wherein said dummy sense amplifier further comprises:

a pull-up device receiving an output precharge signal for precharging the output of said dummy sense amplifier; and wherein said control logic deasserts said output precharge signal while the clock signal is deasserted and asserts said output precharge signal in response to the assertion of the clock signal.

8. The memory control system of claim 7, wherein the memory array includes an array of buffers receiving the sensed output data for providing buffered output data to the array of latches, further comprising:

a delay device coupled to said dummy sense amplifier and said control logic for receiving said timing signal from said dummy sense amplifier and for asserting a delayed timing signal.

9. The memory control system of claim 8, wherein said delay device includes an inverter receiving said timing signal for asserting an inverted timing signal.

10. The memory control system of claim 9, wherein said complementary pair of dummy bit lines includes a positive and negative bit line which are both precharged high, wherein said timing signal is precharged high, and wherein said predetermined logic level is a logic zero such that said positive bit line is asserted low by said fixed memory cell in response to the assertion of said dummy word line select signal.

11. The memory control system of claim 10, wherein said inverter is biased to have a relatively low voltage switching threshold.

12. The memory control system of claim 11, wherein said inverter comprises:

a pull-up device coupled to a source voltage; and a pull-down device coupled between said pull-up device and ground;

wherein said pull-down device is biased to dominate over said pull-up device.

13. The memory control system of claim 12, wherein said pull-up device comprises a P-channel CMOS transistor and wherein said pull-down device comprises and N-channel CMOS transistor, wherein said N-channel transistor has a greater width-to-length ratio than said P-channel transistor for increasing the drain-to-source resistance of said N-channel transistor.

14. The memory control system of claim 8, wherein said delay device comprises a plurality of series-coupled inverters.

15. A memory system, comprising:

a word line decoder receiving a word line enable signal and an address and including a plurality of drivers for asserting one of a plurality of corresponding word line select signals on one of a corresponding plurality of select lines, said word line decoder for decoding said address and for activating a corresponding one of said plurality of drivers in response to the assertion of said word line enable signal, said word line decoder including a dummy driver for asserting a dummy select signal on a dummy select line in response to each assertion of said word line enable signal;

a memory array, comprising:

a core memory including a matrix of core memory cells organized in rows and columns, each core memory cell of each row coupled to and corresponding with one of said plurality of select lines, each core memory cell of each column coupled to a corresponding pair of complementary bit lines for asserting output data; and a dummy row and dummy column of memory cells located on two adjacent outer edges of said core memory for mirroring said rows and columns of said core memory cells, wherein each memory cell of said dummy row is coupled to load said dummy select line and wherein each memory cell of said dummy column is coupled to load a pair of complementary dummy bit lines, said dummy row and dummy column further including a fixed memory cell coupled to said dummy select line for receiving said dummy select signal and for respondingly asserting a predetermined logic level on said pair of complementary dummy bit lines; corresponding pair of complementary bit lines, each being enabled by a sense enable signal for sensing and asserting a corresponding output data bit of said output data when enabled, but otherwise being disabled;

an array of latches receiving a latch signal for latching said sensed output data;

a dummy sense amplifier coupled to said pair of complementary dummy bit line signals for sensing said predetermined logic signal and for respondingly asserting a timing signal, said dummy sense amplifier biased relative to said core sense amplifiers in favor of an opposite logic level as said predetermined logic level; and control logic coupled to said array of latches, said dummy sense amplifier and said word line decoder and receiving a clock signal, said control logic for deasserting said sense enable signal to disable said array of core sense amplifiers while said clock signal is deasserted, for asserting said word line enable signal and said sense enable signal in response the assertion of said clock signal, and for deasserting said word line enable signal and said sense enable signal and for asserting said latch signal in response to the assertion of said timing signal.

16. The memory system of claim 15, wherein each of said array of core sense amplifiers and said dummy sense amplifier comprises:

a level shifter coupled to said pair of complementary bit lines; and a high gain differential amplifier coupled to said level shifter;

wherein each sense amplifier is capable of sensing relatively low voltage levels.

17. The memory system of claim 15, further comprising:

an array of precharge amplifiers each receiving a precharge enable signal for precharging said pairs of complementary bit lines for each column of said core memory including said pair of complementary dummy bit lines; and an array of pull-up devices, each coupled to a corresponding one of said sense amplifiers include said core and dummy sense amplifiers, each pull-up device receiving an output precharge signal for precharging the outputs of said sense amplifiers including said timing signal;

wherein said control logic asserts said output precharge signal and said precharge enable signal while said clock signal is deasserted, and deasserts said output precharge signal and said precharge enable signal in response to the assertion of said clock signal.

18. The memory system of claim 17, further comprising:

an array of buffers coupled to said memory array for providing buffered output data to said array of latches; and an inverter coupled to said dummy sense amplifier and said control logic for receiving said timing signal from said dummy sense amplifier and for asserting an inverted timing signal.

19. The memory system of claim 18, wherein said dummy sense amplifier comprises:

a level shifter including first and second pull-up devices coupled to a source voltage; and first and second pull-down devices coupled between said first and second pull-up devices, respectively, and ground;

wherein said first pull-down device receives a positive bit line signal and said second pull-down device receives a negative bit line signal, and wherein said first pull-up device is biased to have a greater voltage margin than said second pull-up device so that a greater voltage differential occurs between said positive and negative bit line signals before said dummy sense amplifier switches; and said inverter comprising a pull-up device coupled to said source voltage and a pull-down device coupled between said pull-up device and ground, wherein said pull-down device is biased to dominate over said pull-up device.

20. A self-timed memory control system for accessing data in a memory system in response to the assertion of a clock signal, the memory system including a core memory array with rows and columns of core memory cells, a corresponding array of word line decoders for asserting corresponding word line select signals for selecting a row of memory cells, a corresponding array of sense amplifiers receiving a sense enable signal for enabling the sense amplifiers to sense output data in the core memory cells and for disabling the sense amplifiers, and a corresponding array of latches for latching the sensed output data, said control system comprising:

control logic for asserting a word line enable signal and the sense enable signal in response to the assertion of the clock signal, and for deasserting the sense enable signal and asserting a latch signal to latch the sensed output data in response to subsequent assertion of a timing signal;

a dummy column of fixed memory cells located along an adjacent outer edge of the core memory array opposite the word line drivers for mirroring the columns of the core memory cells, wherein each memory cell of said dummy column is coupled to load a pair of complementary dummy bit lines, and wherein each said dummy memory cell receives corresponding word line select signals for respondingly asserting a predetermined logic level on said pair of complementary dummy bit lines; and a dummy sense amplifier coupled to said pair of complementary dummy bit lines at an opposite end of said dummy column as said fixed dummy memory cell for sensing said predetermined logic level and for respondingly asserting said timing signal, said dummy sense amplifier being biased to favor an opposite logic level of said predetermined logic level for adding timing margin.

21. The memory control system of claim 20, wherein each column of core memory cells of the memory array is coupled to a corresponding pair of complementary bit lines, further comprising:

an array of precharge amplifiers receiving a precharge enable signal for precharging the pair of complementary bit lines for each column of the core memory array including said pair of complementary dummy bit lines; and wherein said control logic asserts said precharge enable signal while the clock signal is deasserted and deasserts said precharge enable signal in response to the assertion of the clock signal.

22. The memory control system of claim 21, wherein said dummy sense amplifier comprises:

a level shifter coupled to said pair of complementary dummy bit lines; and a differential amplifier coupled to said level shifter for providing said timing signal.

23. The memory control system of claim 22, wherein said level shifter comprises:

first and second pull-up devices coupled to a source voltage; and first and second pull-down devices coupled between said first and second pull-up devices, respectively, and ground, wherein said first pull-down device receives a positive bit line signal and said second pull-down device receives a negative bit line signal;

wherein said first pull-up device is biased to have a greater voltage margin than said second pull-up device so that a greater voltage differential occurs between said positive and negative bit line signals before said differential amplifier is switched.

24. The memory control system of claim 21, wherein said dummy sense amplifier further comprises:

a pull-up device receiving an output precharge signal for precharging the output of said dummy sense amplifier; and wherein said control logic deasserts said output precharge signal while the clock signal is deasserted and asserts said output precharge signal in response to the assertion of the clock signal.

25. The memory control system of claim 24, wherein the memory array includes an array of buffers receiving the sensed output data for providing buffered output data to the array of latches, further comprising:

a delay device coupled to said dummy sense amplifier and said control logic for receiving said timing signal from said dummy sense amplifier and for asserting a delayed timing signal.

26. The memory control system of claim 25, wherein said delay device includes an inverter receiving said timing signal for asserting an inverted timing signal.

27. The memory control system of claim 26, wherein said complementary pair of dummy bit lines includes a positive and negative bit line which are both precharged high, wherein said timing signal is precharged high, and wherein said predetermined logic level is a logic zero such that said positive bit line is asserted low by said fixed memory cell in response to the assertion of said dummy word line select signal.

28. The memory control system of claim 27, wherein said inverter is biased to have a relatively low voltage switching threshold.

29. The memory control system of claim 28, wherein said inverter includes a P-channel CMOS transistor and an N-channel CMOS transistor, wherein said N-channel transistor has a greater width-to-length ratio than said P-channel transistor for increasing the drain-to-source resistance of said N-channel transistor.

30. A method for controlling a memory device in response to assertion of a clock signal for low power consumption, the memory device including a core memory array and a corresponding array of sense amplifiers, comprising the steps of:

providing a dummy path of memory cells adjacent the core memory array forming a worst case timing path corresponding to the size of the core memory array;

activating the array of sense amplifiers in response to a memory access;

the dummy path of memory cells asserting a predetermined logic level on a pair of complementary dummy bit lines in response to a memory access;

providing a dummy sense amplifier for detecting the predetermined logic level and for asserting a timing signal, and further biasing the dummy sense amplifier to favor an opposite logic level as the predetermined logic level for adding timing margin;

providing an inverter having an input for detecting the timing signal and an output for asserting an inverted timing signal, and further biasing the input of the inverter to favor the opposite logic level for adding timing margin;

latching the output data of the core memory array in response to the inverted timing signal being asserted; and turning off the array of sense amplifiers when the output data is latched.

31. The method of claim 30, further comprising the step of:

precharging the output of the dummy sense amplifier to the opposite logic level.

* * * * *